United States Patent
Sakino et al.

(10) Patent No.: US 6,644,855 B2
(45) Date of Patent: Nov. 11, 2003

(54) STAGE DEVICE, EXPOSURE APPARATUS, DEVICE MANUFACTURING METHOD AND MOVEMENT GUIDANCE METHOD

(75) Inventors: Shigeo Sakino, Kanagawa (JP); Mitsuru Inoue, Tochigi (JP); Tadayuki Kubo, Ibaraki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/073,594

(22) Filed: Feb. 12, 2002

(65) Prior Publication Data

US 2002/0118897 A1 Aug. 29, 2002

(30) Foreign Application Priority Data

Feb. 27, 2001 (JP) ........................................ 2001-052136

(51) Int. Cl.[7] .............................................. F16C 17/00
(52) U.S. Cl. ............................................................ 384/9
(58) Field of Search .............................. 384/9, 12, 16, 384/114, 15

(56) References Cited

U.S. PATENT DOCUMENTS

| | | | |
|---|---|---|---|
| 4,744,675 A | 5/1988 | Sakino et al. .................. 384/12 |
| 5,040,431 A | 8/1991 | Sakino et al. .................. 74/479 |
| 5,280,677 A | 1/1994 | Kubo et al. ..................... 35/568 |
| 5,685,232 A | 11/1997 | Inoue ............................. 108/20 |
| 5,784,925 A | 7/1998 | Trost et al. ............... 74/490.09 |
| 5,909,272 A | 6/1999 | Osanai et al. ................... 355/53 |
| 5,933,215 A | 8/1999 | Inoue et al. ..................... 355/53 |
| 6,122,059 A | 9/2000 | Inoue et al. ................... 356/358 |
| 6,133,982 A | 10/2000 | Inoue et al. ..................... 355/30 |
| 6,172,738 B1 | 1/2001 | Korenaga et al. .............. 355/53 |
| 6,320,645 B1 | 11/2001 | Inoue et al. ..................... 355/53 |

FOREIGN PATENT DOCUMENTS

JP    2000-506963    6/2000

*Primary Examiner*—Lenard A. Footland
(74) *Attorney, Agent, or Firm*—Fitzpatrick, Cella, Harper & Scinto

(57) ABSTRACT

A stage device includes a table having a reference plane parallel to first and second directions; a driving body movable along the first direction; a moving body movable along the second direction with respect to the driving body; a static pressure bearing provided on the moving body; an exhaust groove provided surrounding the static pressure bearing; and a mechanism for delivering a gas of the static pressure bearing recovered by the exhaust groove between the moving body and the driving body. The adverse affects of piping on the moving body can be reduced and it is possible to position the moving body with high precision.

47 Claims, 16 Drawing Sheets

FLOW OF SEMICONDUCTOR DEVICE MANUFACTURE

STAGE DEVICE, EXPOSURE APPARATUS, DEVICE MANUFACTURING METHOD AND MOVEMENT GUIDANCE METHOD

FIELD OF THE INVENTION

The present invention relates to a stage device for performing high-speed movement and precise positioning or for highly precise scanning in a non-atmospheric environment (special environment) of an electron beam lithography system or precision measurement equipment, etc., and to an exposure apparatus that uses this device.

BACKGROUND OF THE INVENTION

As illustrated in the specification of Japanese Patent Application No. 2000-506963, the conventionally constructed stage is obtained by constructing single-axis stages between two rods, passing two rods between the single-axis stages and constructing a stage that moves in the XY plane. Further, air (gas) is supplied by connecting a flexible tube to the moving body, and the air (gas) is collected by a bellows and a flexible tube connected to the moving body.

However, the conventional arrangement is constituted by two radial-type bearings and therefore has the following drawbacks:

(1) Since a radial-type bearing is a full-restraint bearing, it is necessary to assure that the two bearings remain parallel, and assembly and adjustment of the two bearings is difficult.

(2) Bearing clearance varies owing to a change in temperature or the like, as a result of which the control characteristic changes, or bearing clearance vanishes. This can lead to destruction of the bearings.

(3) The rods become deformed owing to the position of the stage, as a result of which there is a decline in static attitude precision.

(4) Vibration in all directions of six degrees of freedom of the X, Y stages undergoes coupling to degrade attitude precision dynamically as well.

(5) If a bellows is used, frictional resistance is produced and causes a decline in precision and the production of dust. Further, maintenance such as periodic replacement of the bellows is required.

Further, piping for supplying air to and exhausting it from the moving body is provided. This leads to the following problems:

(1) The piping offers frictional resistance, as a result of which there is a decline in attitude and positioning precision.

(2) The piping sustains wear owing to movement of the stages, and hence there is the danger that dust will be produced.

(3) As a result of piping wear and damage caused by movement of the stages, there is the danger that air will flow into a vacuum chamber.

SUMMARY OF THE INVENTION

The present invention has been proposed to solve the problems of the prior art and has as its object to provide a stage device comprising: a table having a reference plane parallel to first and second directions; a driving body movable along the first direction; a moving body movable along the second direction with respect to the driving body; a static pressure bearing provided on the moving body; an exhaust groove provided surrounding the static pressure bearing; and a mechanism for delivering a gas of the static pressure bearing recovered by the exhaust groove between the moving body and the driving body.

The stage device preferably is such that the static pressure bearing is provided between the moving body and the table, and the mechanism has a delivery member provided between the moving body and the driving body.

The stage device preferably is such that the static pressure bearing is provided between the moving body and the driving body, and the mechanism is such that the exhaust groove functions also as a delivery member.

The stage device preferably is such that the delivery member has a rectangular groove.

The stage device preferably is such that the rectangular groove has its longitudinal direction parallel to the second direction.

The stage device preferably is such that recovery ports are provided opposing the delivery member.

The stage device preferably is such that the delivery member is provided on the moving body and the recovery ports are provided on the driving body.

The stage device preferably is such that the delivery member is provided on the driving body and the recovery ports are provided on the moving body.

The stage device preferably is such that the delivery member has a plurality of grooves.

The stage device preferably is such that a groove on an outer side of the delivery member surrounds a groove on an inner side thereof.

The stage device preferably is such that pressure within the groove on the outer side of the delivery member is set to be lower than pressure within the groove on the inner side thereof.

The stage device preferably is such that a plurality of exhaust grooves are provided surrounding the static pressure bearing.

The stage device preferably is such that an outer groove among the exhaust grooves is formed so as to surround the grooves on the inner side.

The stage device preferably is such that pressure within an outer groove of the exhaust grooves is set to be lower than pressure within the grooves on the inner side thereof.

The stage device preferably further comprises a delivery member provided between the driving body and the table for delivering a gas of the static pressure bearing recovered by the exhaust groove between the driving body and the table.

The stage device preferably is such that the delivery member provided between the driving body and the table has a rectangular groove.

The stage device preferably is such that the rectangular groove has its longitudinal direction is parallel to the first direction.

The stage device preferably is such that the delivery member provided between the driving body and the table has a plurality of grooves.

The stage device preferably is such that an outer groove of the delivery member is formed so as to surround the grooves on the inner side.

The stage device preferably is such that pressure within an outer groove is set to be lower than pressure within the grooves on the inner side thereof.

The stage device preferably further comprises a vacuum pump for recovering a gas of the static pressure bearing recovered by the exhaust grooves.

The stage device preferably is such that the vacuum pump recovers gas of the static pressure bearing via the delivery member provided between the moving body and the driving body and the delivery member provided between the driving body and the table.

The stage device preferably is such that the device is used in a vacuum environment.

The stage device preferably further comprises a driving body movable along the second direction, wherein the moving body is movable along the first direction with respect to the driving body movable along the second direction.

According to another aspect of the present invention, a stage device for solving the aforementioned problems of the prior art comprises: a table having a reference plane parallel to first and second directions; a first driving body movable along the first direction; a second driving body movable along the second direction; a moving body movable along the second direction with respect to the first driving body, movable along the first direction with respect to the second driving body, and movable along the reference plane; a first radial bearing unit for supporting the first driving body movably in the first direction; a first plane bearing unit for restraining the first driving body vertically; a second radial bearing unit for supporting the second driving body movably in the second direction; and a second plane bearing unit for restraining the second driving body vertically.

The stage device preferably is such that the first and second radial bearing units each have a static pressure bearing secured to the table.

The stage device preferably is such that the first and second radial bearing units each further include an exhaust groove, which is for recovering gas of the static pressure bearing, on an outer side of the static pressure bearing.

The stage device preferably is such that a plurality of the exhaust grooves are provided.

The stage device preferably is such that the first and second plane bearing units each have a static pressure bearing secured to the table.

The stage device preferably is such that the first and second plane bearing units each further include an exhaust groove, which is for recovering gas of the static pressure bearing, surrounding the static pressure bearing.

The stage device preferably is such that a plurality of the exhaust grooves are provided.

The stage device preferably is such that an outer groove among the plurality of exhaust grooves is formed so as to surround the grooves on the inner side.

The stage device preferably is such that pressure within the outer groove is set to be lower than pressure within the grooves on the inner side thereof.

An exposure apparatus having the above-described stage device also falls within the scope of the present invention.

The stage device preferably further comprises a chamber surrounding the stage device.

The exposure apparatus preferably is such that the apparatus is an electron beam exposure apparatus or an EUV exposure apparatus.

A method of manufacturing a semiconductor device using this exposure apparatus also falls within the scope of the present invention.

A movement guidance method according to the present invention comprises the steps of: establishing negative pressure in a recovery passage provided in a table; establishing negative pressure in a groove of a delivery member provided between a driving body, which is movable in a first direction, and the table; establishing negative pressure in a recovery passage provided in the driving body; establishing negative pressure in a groove of a delivery member provided between a moving body, which is movable in a second direction with respect to the driving body, and the driving body; and establishing negative pressure in an exhaust groove surrounding a static pressure bearing provided on the moving body.

A movement guidance method according to the present invention comprises the steps of: recovering gas from a static pressure bearing, which is provided on a moving body, by an exhaust groove provided surrounding the static pressure bearing; delivering the gas from the static pressure bearing recovered by the exhaust groove to a driving body via a delivery member provided between the driving body, which drives the moving body in a first direction, and the moving body; passing the recovered gas through a recovery passage provided in the driving body; delivering the recovered gas to a table via a delivery member provided between the driving body and the table; and exhausting the recovered gas via a recovery passage provided in the table.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Preferred embodiments of the present invention will now be described in detail in accordance with the accompanying drawings.

<Embodiments of Stage Device>

<First Embodiment>

(Overall Structure)

Figure 1:
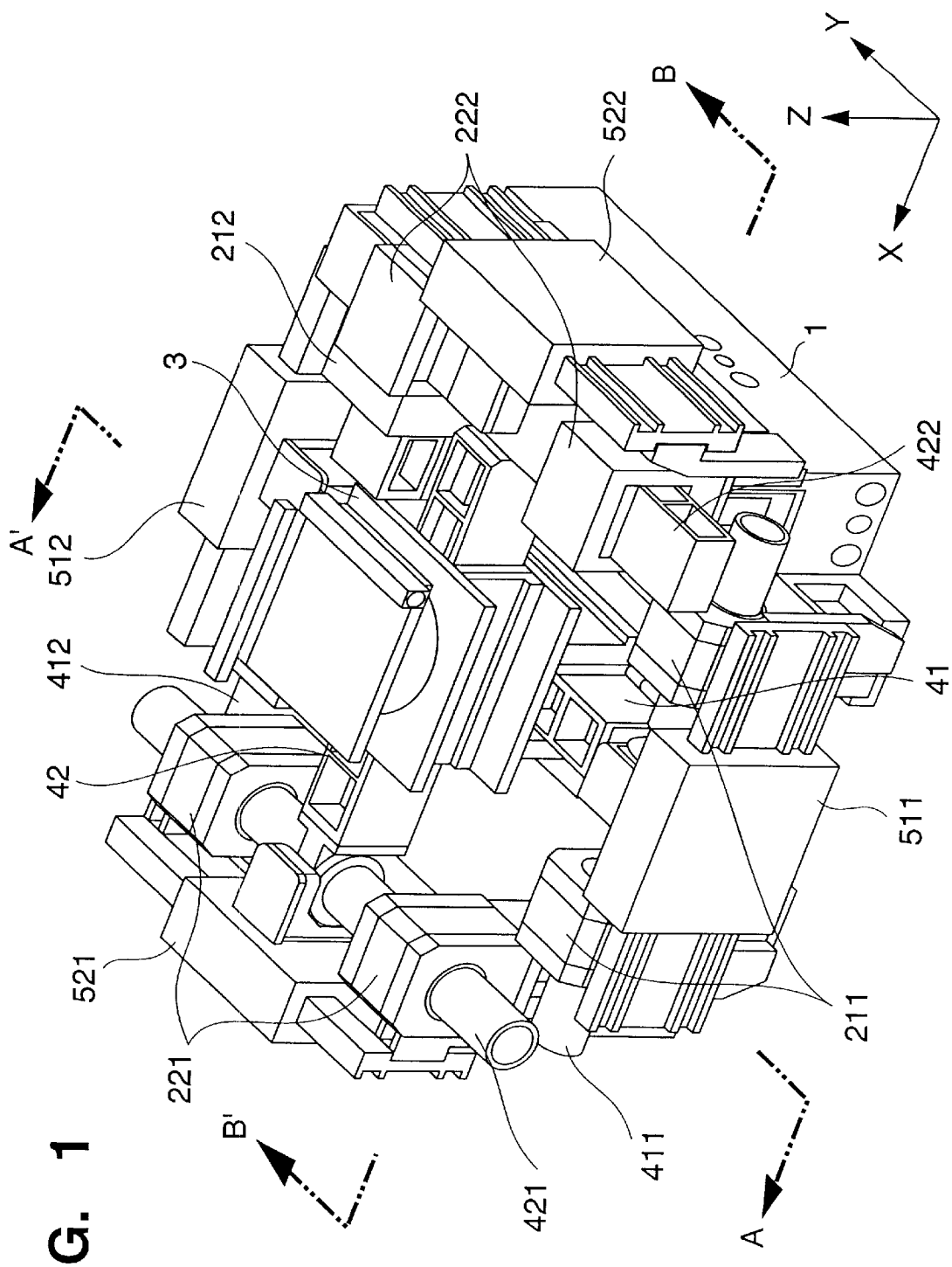
FIG. 1 is a perspective view illustrating the entirety of a stage device according to a first embodiment of the present invention.
Figure 2:
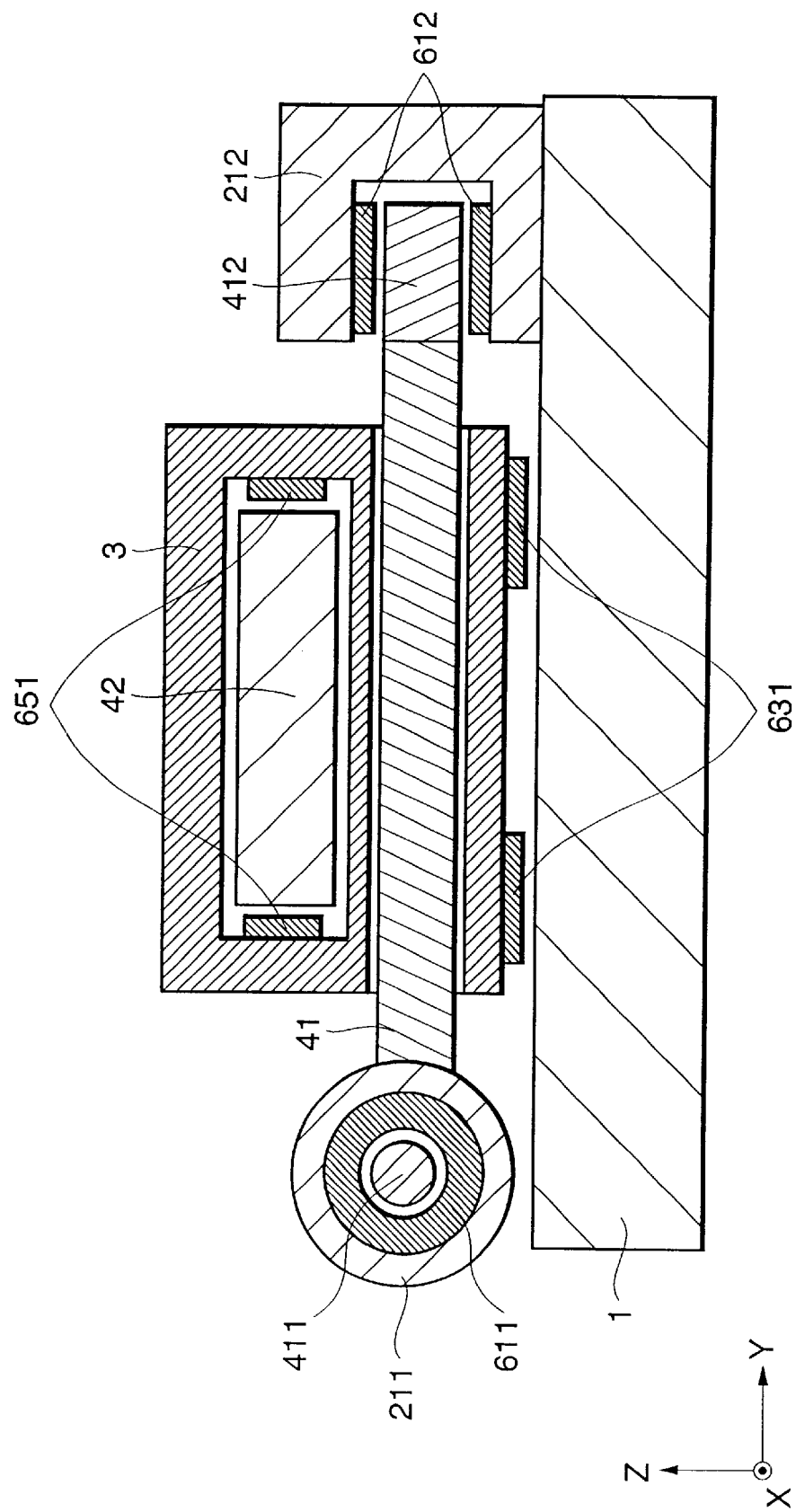
FIG. 2 is a sectional view taken along A–A' of FIG. 1.
Figure 3:
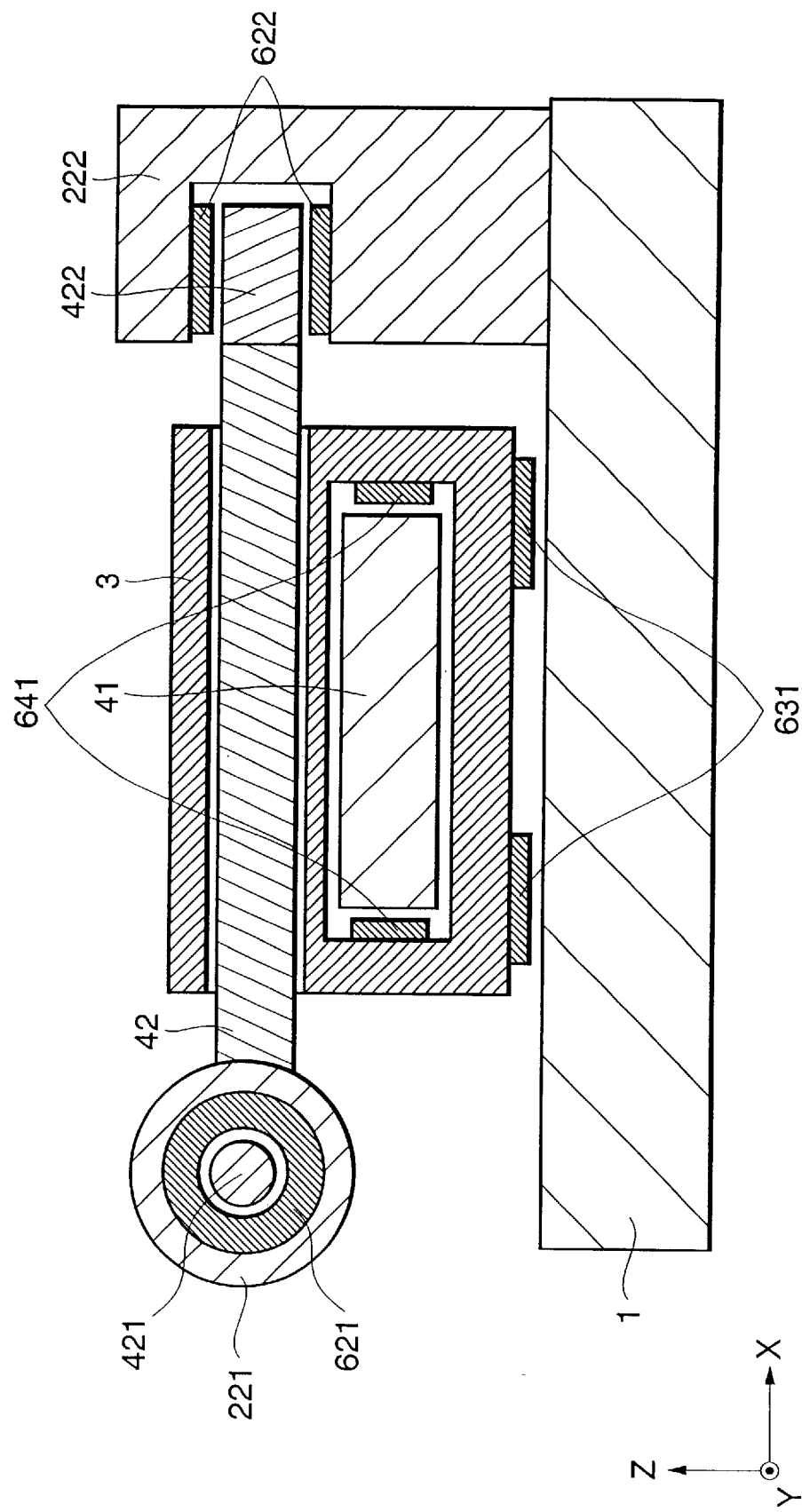
FIG. 3 is a sectional view taken along A–A' of FIG. 1.

FIG. 1 is a perspective view illustrating the entirety of a stage device according to a first embodiment of the present invention, FIG. 2 is a sectional view obtained by cutting away the stage device of FIG. 1 along the A–A' plane, and FIG. 3 is a sectional view obtained by cutting away the stage device of FIG. 1 along the B–B' plane.

As shown in the drawings, reference numeral 1 denotes a table having a reference plane. The device includes an X radial bearing unit 211 along the X direction, an X plane bearing unit 212 along the X direction, a Y radial bearing unit 221 along the Y direction and a Y plane bearing unit 222 along the Y direction. The structures of these units will be described later.

Numeral 3 denotes an XY moving body. The XY moving body 3 mounts an object (not shown) and is capable of being moved along the X and Y directions.

An X driving body 41 is capable of being moved along the X direction. An X radial guide 411 is provided as an integral part of the X driving body 41. The X radial guide 411 is supported movably in the X direction by the X radial bearing unit 211. An X plane guide 412 is provided as an integral part of the X driving body 41. The X plane guide 412 is supported movably in the X direction by the X plane bearing unit 212. A Y driving body 42 is capable of being moved along the Y direction. A Y radial guide 421 is provided as an integral part of the Y driving body 42. The Y radial guide 421 is supported movably in the Y direction by the Y radial bearing unit 221. A Y plane guide 422 is provided as an integral part of the Y driving body 42. The Y plane guide 422 is supported movably in the Y direction by the Y plane bearing unit 222.

Linear motors 511 and 512 are for driving the X driving body 41 along the X direction. When the linear motors 511 and 512 produce a driving force in the X direction, the X driving body 41, X radial guide 411 and X plane guide 412 are driven in unison along the X direction. The XY moving body 3 also is driven along the X direction together with these components. Linear motors 521 and 522 are for driving the Y driving body 42 along the Y direction. When the linear motors 521 and 522 produce a driving force in the Y direction, the Y driving body 42, Y radial guide 421 and Y plane guide 422 are driven in unison along the Y direction. The XY moving body 3 also is driven along the Y direction together with these components. Since drive is performed by two linear motors, the driving force can be adjusted appropriately based upon the position of the XY moving body 3, thereby making it possible to suppress the occurrence of yawing vibration of the XY moving body 3. In this embodiment, the linear motors 511, 512 are used to drive the X driving body 41 and Y driving body 42. However, this does not impose a limitation upon the invention. For example, another driving mechanism such as an ultrasonic motor may be used.

In FIG. 2, an X radial static pressure bearing 611 is provided on the X radial bearing unit 211. The X radial static pressure bearing 611 supports the X radial guide 411 contactlessly in such a manner that the guide 411 can be moved along the X direction. An X plane static pressure bearing 612 is provided on the X plane bearing unit 212. The X plane static pressure bearing 612 supports the X plane guide 412 contactlessly in such a manner that the guide 412 can be moved along the X direction. In FIG. 3, a Y radial static pressure bearing 621 is provided on the Y radial bearing unit 221. The Y radial static pressure bearing 621 supports the Y radial guide 421 contactlessly in such a manner that the guide 421 can be moved along the Y direction. A Y plane static pressure bearing 622 is provided on the Y plane bearing unit 222. The Y plane static pressure bearing 622 supports the Y plane guide 422 contactlessly in such a manner that the guide 422 can be moved along the Y direction. An XY static pressure bearing 631 is provided on the XY moving body 3, as shown in FIGS. 2 and 3. The XY static pressure bearing 631 supports the XY moving body 3 on the reference plane of the table 1 contactlessly in such a manner that the XY moving body 3 is movable in the X and Y directions. In FIG. 3, a Y static pressure bearing 641 is provided on the XY moving body 3. The Y static pressure bearing 641, which is provided so as to oppose the guide surface provided on the X driving body 41, supports the XY moving body 3 contactlessly with respect to the X driving body 41 in such a manner that the XY moving body 3 is movable along the Y direction. When the X driving body 41 is driven in the X direction, the XY moving body 3 receives an X-direction driving force from the X driving body 41 via the Y static pressure bearing 641. In FIG. 2, an X static pressure bearing 651 is provided on the XY moving body 3. The X static pressure bearing 651, which is provided so as to oppose the guide surface provided on the Y driving body 42, supports the XY moving body 3 contactlessly with respect to the Y driving body 42 in such a manner that the XY moving body 3 is movable along the X direction. When the Y driving body 42 is driven in the Y direction, the XY moving body 3 receives a Y-direction driving force from the Y driving body 42 via the X static pressure bearing 651.

In a case where the above-described stage device is used in a vacuum environment, for example, the pressure within the vacuum environment can no longer be kept low if the fluid used leaks into the environment from the static pressure bearings. It is required, therefore, that the fluid of the static pressure bearings be prevented from leaking to the outside to the greatest extent possible. Accordingly, the stage device of this embodiment is provided with an exhaust mechanism for recovering the fluid of the static pressure bearings, as set forth below.

According to this embodiment, static pressure bearings are used and therefore transfer of vibration can be suppressed via the clearance of the static pressure bearings. This makes it possible to maintain dynamic attitude precision. Further, since the static pressure bearings provide contactless support and therefore do not produce friction, dust and heat are not produced, precision is high and maintenance is easy to perform.

(Structure of Bearing Unit)

Figure 4:
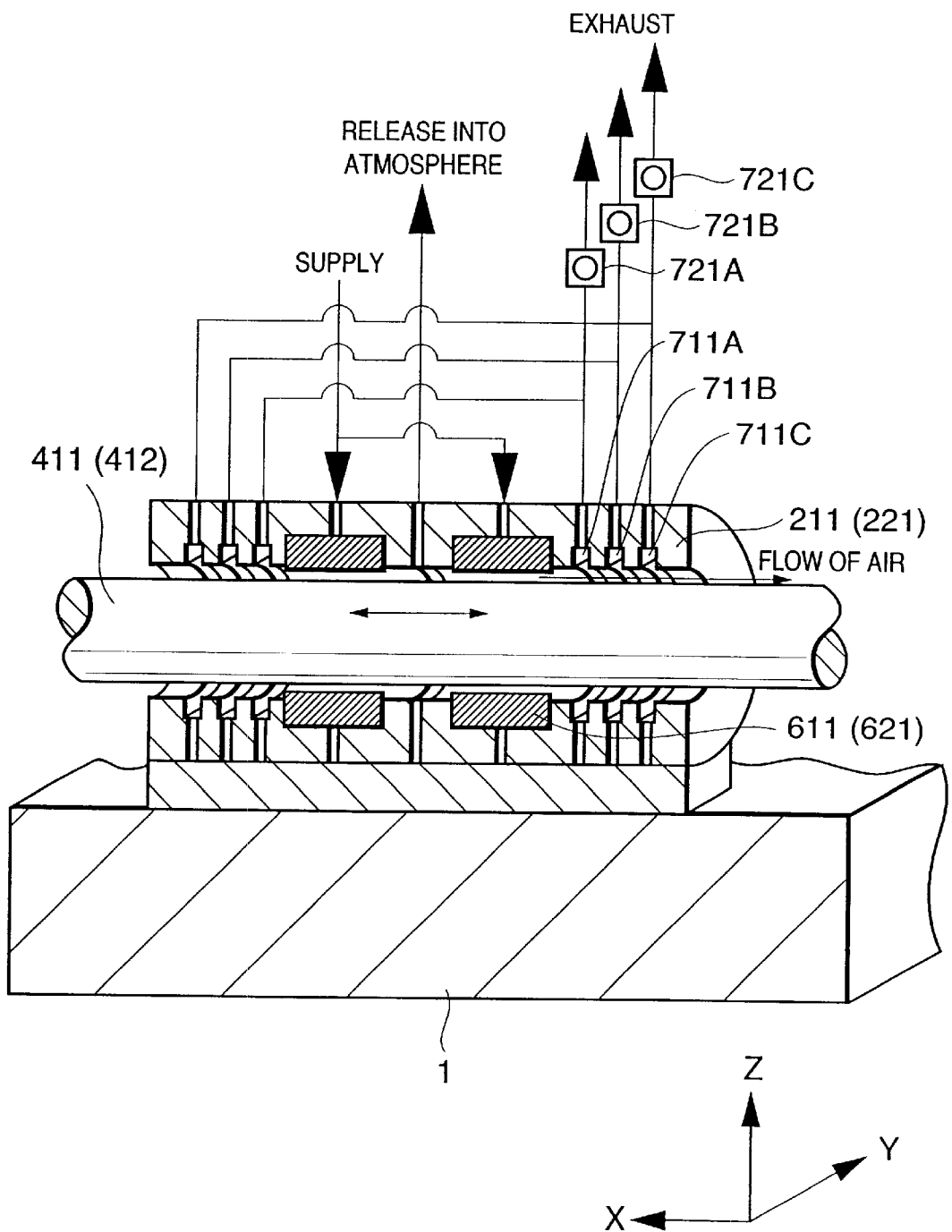
FIG. 4 is a sectional view of a radial bearing unit.

FIG. 4 is a sectional view of the X radial bearing unit 211 or Y radial bearing unit 221.

In FIG. 4, the X radial bearing unit 211 (or Y radial bearing unit 221), which includes the X radial static pressure bearing 611 (or Y radial static pressure bearing 621), is integrally secured to the table 1. The X radial guide 411 (or Y radial guide 421) is supported by the X radial static pressure bearing 611 so as to be movable to the left and right in FIG. 4.

Exhaust grooves 711 are provided in the X radial bearing unit 211. The exhaust grooves 711 are provided on the outer side of the X radial static pressure bearing 611 and form labyrinth grooves. The exhaust grooves 711 communicate with vacuum pumps 721A, 721B, 721C. The vacuum pumps 721 forcibly exhaust the gas in the space between the exhaust grooves 711 and X radial guide 411.

The plurality of exhaust grooves 711 (711A to 711C) form a labyrinth mechanism, and the plurality of vacuum pumps 721 (721A to 721C) communicate with respective ones of the grooves. In this case, the pressure within the exhaust grooves 711 is set so that the closer the groove to the outside, the lower the pressure. In other words, the pressure is set in such a manner that the pressure within the exhaust groove 711C on the outer side will be lower than the pressure within the exhaust groove 711A on the inner side.

The gas ejected from the X radial static pressure bearing 611 is forcibly exhausted by the exhaust grooves 711 and vacuum pumps 721. As a result, release of the gas from the X radial static pressure bearing 611 to the outside can be reduced. Though the exhaust grooves 711 are provided outboard of the X radial static pressure bearing 611, exhaust ports may be provided inboard of the X radial static pressure bearing 611. In such case the exhaust of gas from the exhaust ports may be achieved by release into the atmosphere rather than by use of vacuum pumps.

Figure 5:
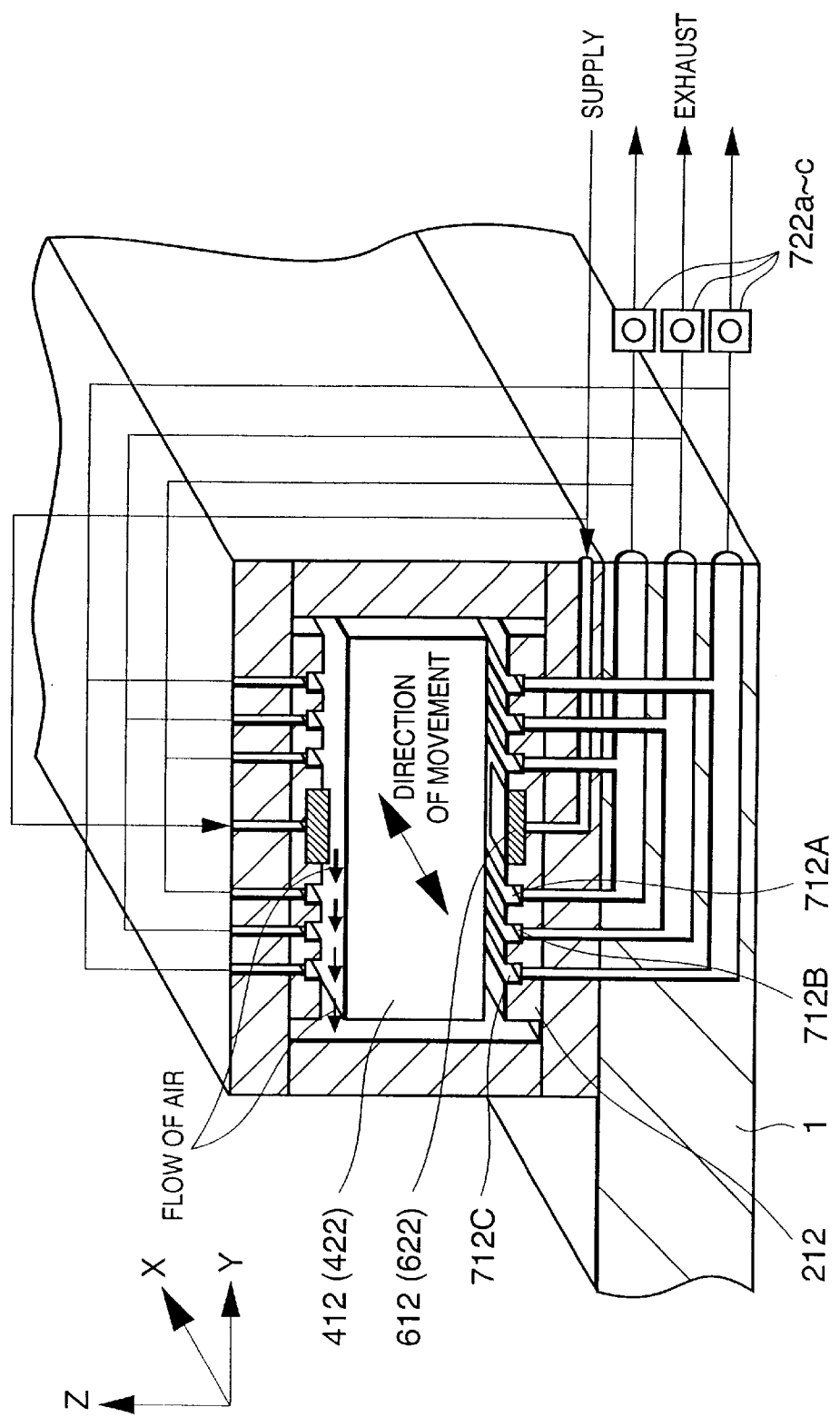
FIG. 5 is a sectional view of a plane bearing unit.
Figure 6:
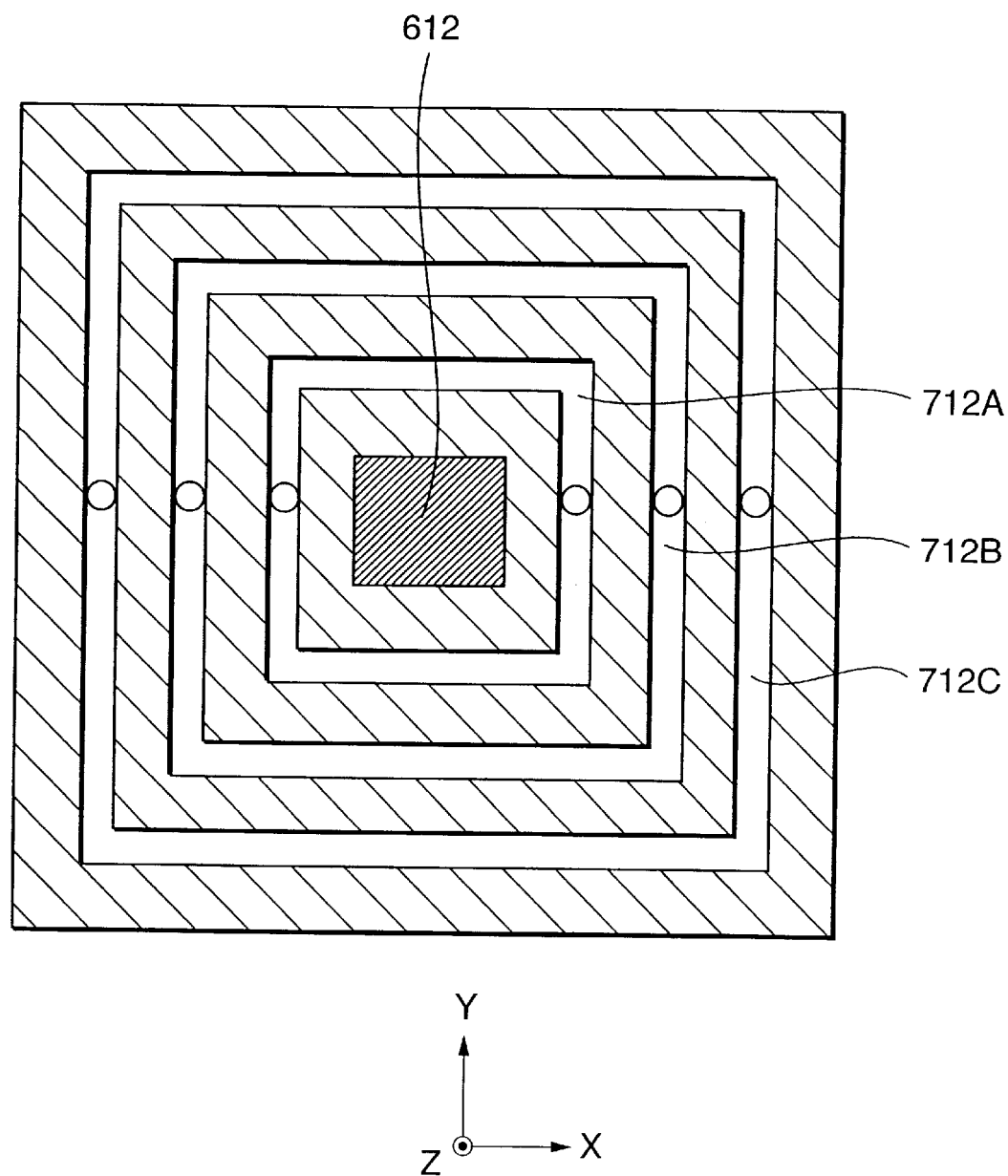
FIG. 6 is a diagram useful in describing the labyrinth structure of a static pressure bearing.

FIG. 5 is a sectional view of the X plane bearing unit 212 or Y plane bearing unit 222, and FIG. 6 is a diagram useful in describing the labyrinth mechanism of the plane bearing units.

In FIGS. 5 and 6, the X plane bearing unit 212 (or Y plane bearing unit 222), which includes the X plane static pressure bearing 612 (or Y plane static pressure bearing 622), is integrally secured to the table 1. The X plane guide 412 (or Y plane guide 422) is supported by the X plane static pressure bearing 612 so as to be movable to the left and right in FIG. 5.

Exhaust grooves 712 are provided in the X plane bearing unit 212. The exhaust grooves 712 are provided on the outer side of the X plane static pressure bearing 612 and form labyrinth grooves. In other words, the exhaust grooves 712 are provided in a rectangular configuration so as to surround the X plane static pressure bearing 612. The exhaust grooves 712 communicate with vacuum pumps 722A, 722B, 722C. The vacuum pumps 722 forcibly exhaust the gas in the space between the exhaust grooves 712 and X plane guide 412.

The plurality of exhaust grooves 712 (712A to 712C) form a labyrinth mechanism. The plurality of vacuum pumps 722 (722A to 722C) communicate with respective ones of the grooves. In this case, the pressure within the exhaust grooves 712 is set so that the closer the groove to the outside, the lower the pressure. In other words, the pressure is set in such a manner that the pressure within the exhaust groove 712C on the outer side will be lower than the pressure within the exhaust groove 712A on the inner side.

The Y radial bearing units 221, 222 apply restraint only vertically and not in the X, Y directions. Accordingly, even if the X-direction driving body or Y-direction driving body undergoes thermal deformation owing to a change in temperature, the bearing clearance does not change.

Rectangularly configured exhaust grooves are provided in the XY static pressure bearing 631, Y static pressure bearing 641 and X static pressure bearing 651 as well in a manner similar to the provision of the rectangularly configured exhaust grooves 712 in the plane static pressure bearings 612, 622 of the radial bearing units 221, 222.

The gas ejected from the plane static pressure bearings is forcibly exhausted by the rectangularly configured exhaust grooves and vacuum pumps. As a result, release of the gas from the plane static pressure bearings to the outside can be reduced.

As described above, in this embodiment the X driving body 41 or Y driving body 42 is guided by one radial bearing unit and one plane bearing unit. Even if a change in temperature occurs, therefore, bearing clearance will not change. It is also easy to carry out assembly and adjustment. In addition, coupling of vibration of the X driving body 41 and Y driving body 42 does not occur, as a result of which attitude precision is improved dynamically.

(Exhaust System Delivery Between XY Moving Body and X Driving Body)

Figure 7:
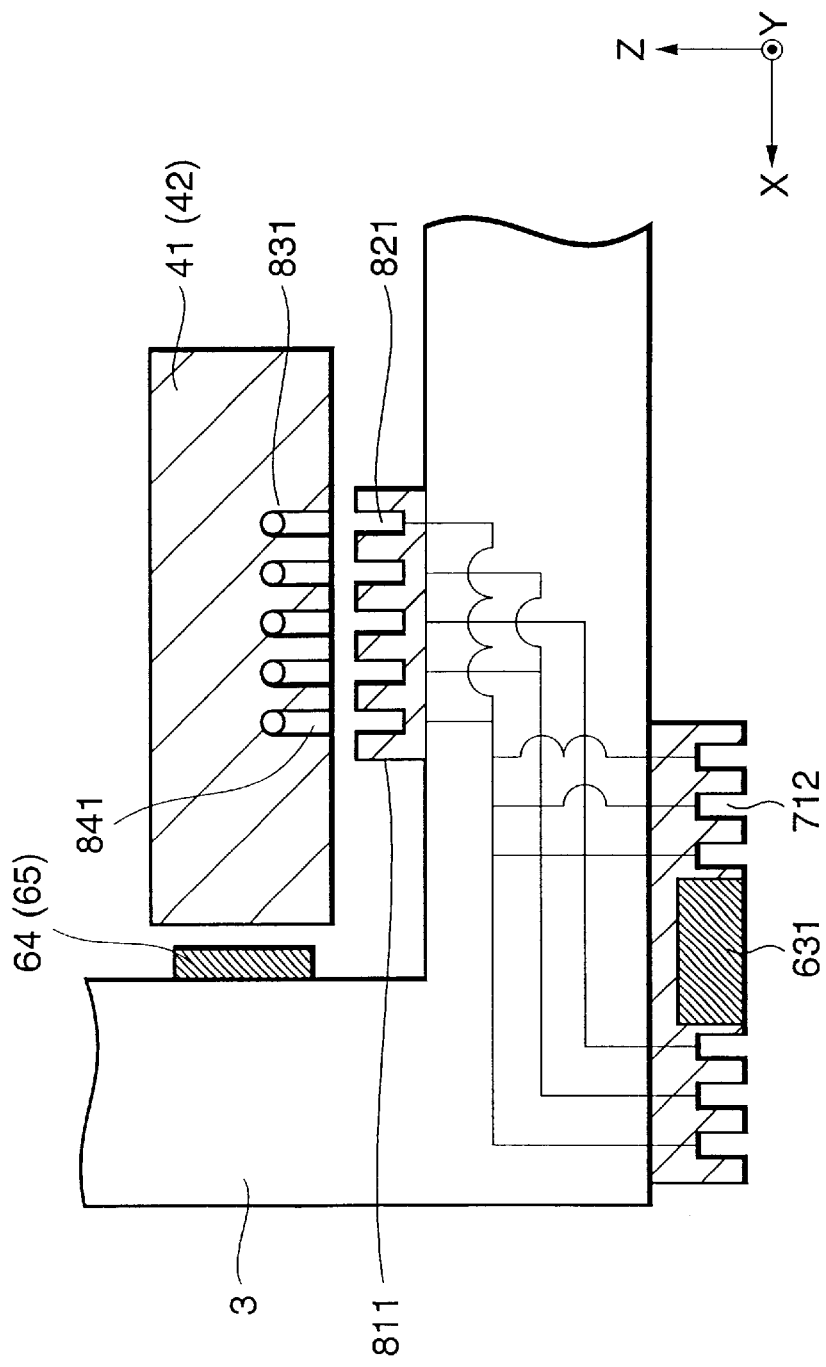
FIG. 7 is a diagram (XZ sectional view) useful in describing exhaust system delivery between an XY moving body and an X driving body.
Figure 8:
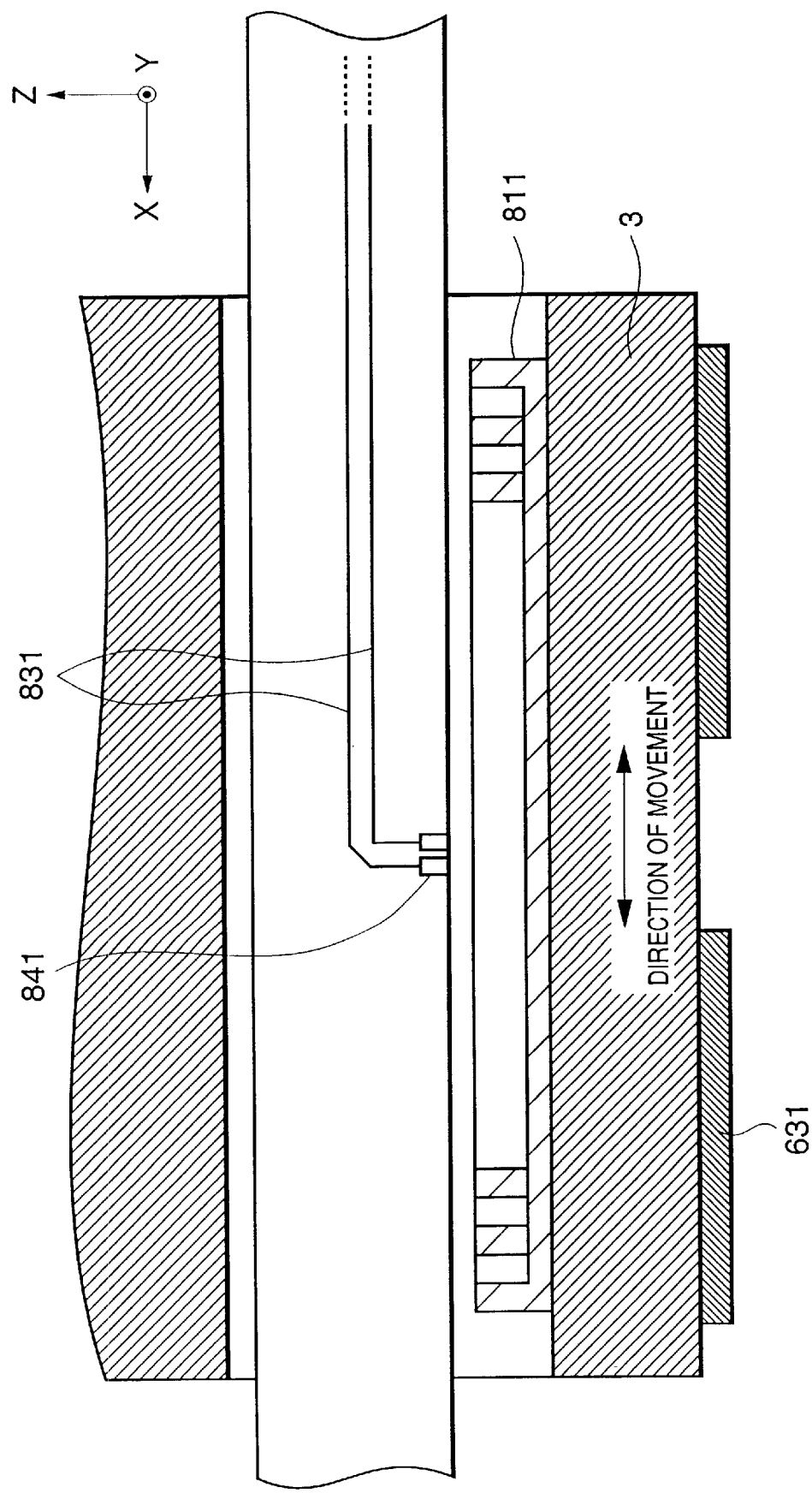
FIG. 8 is a diagram (YZ sectional view) useful in describing exhaust system delivery between an XY moving body and an X driving body.
Figure 9:
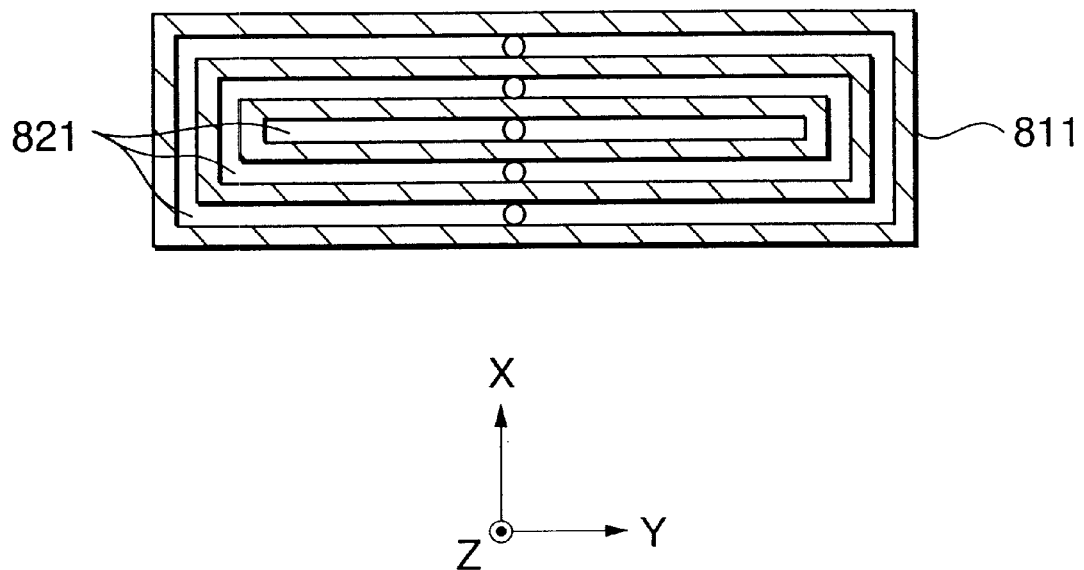
FIG. 9 is a diagram useful in describing the shape of a delivery member.

FIGS. 7 and 8 are diagrams useful in describing the arrangement of the exhaust system for XY moving body 3, in which FIG. 7 is a diagram of the XZ plane as seen along the Y direction and FIG. 8 is a diagram of the YZ plane as seen along the X direction. FIG. 9 is a diagram useful in describing the shape of a delivery member in the exhaust system.

The XY moving body 3 is supported contactlessly with respect to the table 1 by the XY static pressure bearing 631. The plurality of exhaust grooves 712 are provided surrounding the XY static pressure bearing 631 in a manner similar to that shown in FIG. 6. (The exhaust grooves are not shown in FIG. 8.) Accordingly, a mechanism for establishing negative pressure within the exhaust grooves 712 and recovering the gas from the XY static pressure bearing 631 is required. In this embodiment, gas that has been ejected from the XY static pressure bearing 631 of the XY moving body 3 is recovered by the exhaust grooves 712 and is exhausted to the outside via the X driving body 41 (or Y driving body 42).

A delivery member 811 is for handling exhaust between the XY moving body 3 and X driving body 41. The delivery member 811 is provided between the XY moving body 3 and X driving body 41. In this embodiment, the delivery member 811 is provided on the side of the XY moving body 3. The delivery member 811 has a plurality of rectangularly configured recovery grooves 821. The recovery grooves 821 of the delivery member 811 communicate with the exhaust grooves 712 provided on the outer periphery of the XY static pressure bearing 631.

A plurality of recovery passages 831 are provided in the X driving body 41 (or Y driving body 42). A plurality of recovery ports 841 provided at positions opposing the delivery member 811 are disposed on the side of the X driving body 41.

The recovery ports 841 are required to oppose the recovery grooves 821 of the delivery member 811 at all times. Meanwhile, the XY moving body 3 is moved along the Y direction with respect to the X driving body 41. Accordingly, the recovery grooves 821 of the delivery member 811 are rectangularly shaped grooves the longitudinal direction of which extends along the Y direction.

Negative pressure (described later) is established within the recovery passages 831 provided in X driving body 41. Accordingly, the gas within the recovery grooves 821 of the delivery member 811 is withdrawn via the recovery ports 841 so that negative pressure will be produced within the recovery grooves 821 of the delivery member 811. When negative pressure is established within the recovery grooves 821 of the delivery member 811, negative pressure is produced within the exhaust grooves 712 as well because the recovery grooves 821 and exhaust grooves 712 communicate with each other. As a result, the gas ejected from the static pressure bearing 631 is withdrawn by the exhaust grooves 712 and is delivered contactlessly between the XY moving body 3 and the X driving body 41 by the delivery member 811 and recovery ports 841 so that the gas is exhausted to the outside via the X driving body 41.

As mentioned above, the pressure within the exhaust grooves 712 is lower the closer the groove is to the outer side. Similarly, it may be so arranged that the pressure within the plurality of recovery grooves 821 provided in the delivery member 811 is lower the closer the groove is to the outer side. This is to assure that the recovered gas will not leak to the outside. Accordingly, the inner-side groove of the exhaust grooves 712 communicates with the inner-side groove of the recovery grooves 821. Further, the outer-side groove of the exhaust grooves 712 communicates with the outer-side groove of the recovery grooves 821.

Figure 10:
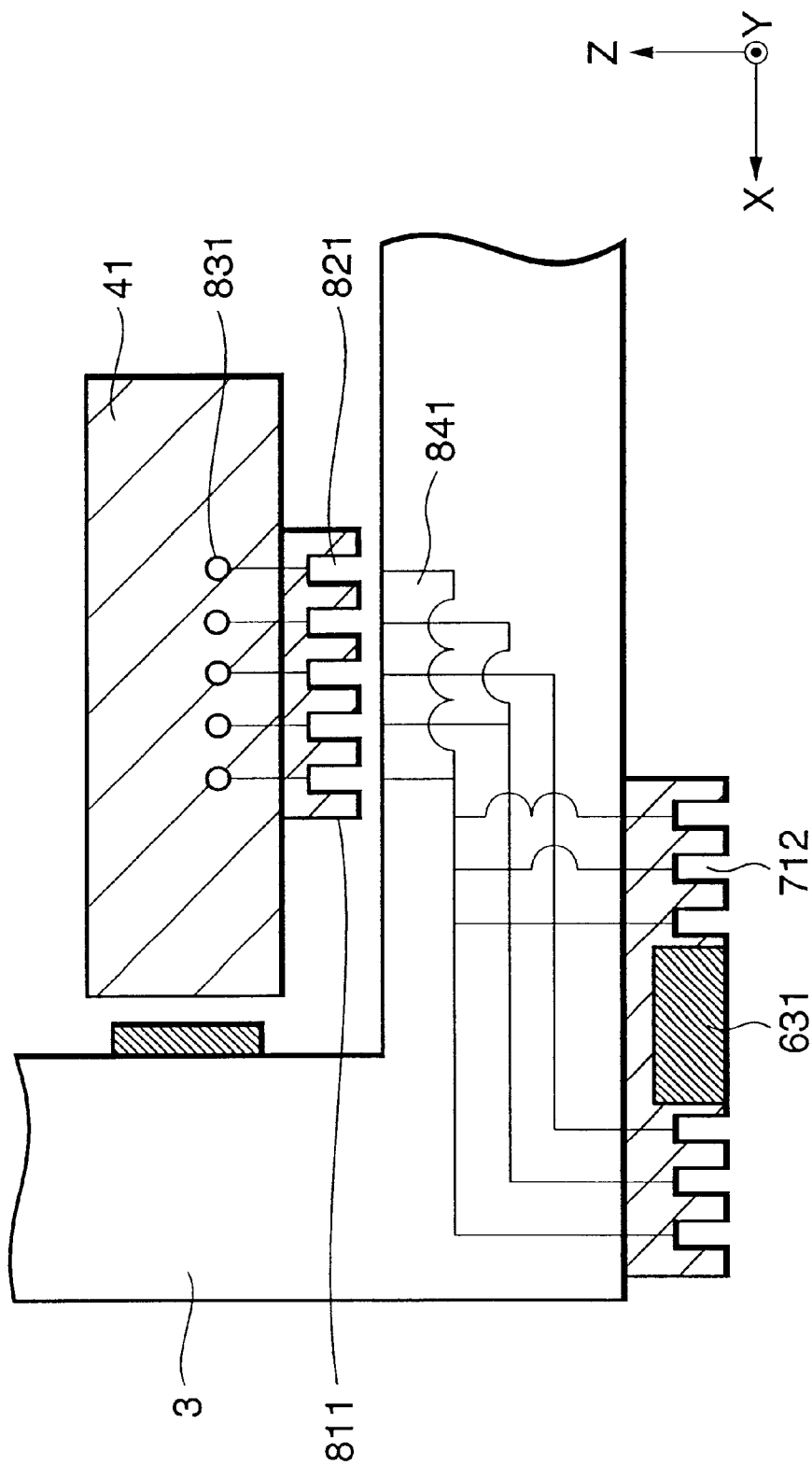
FIG. 10 is a diagram for describing another example of exhaust system delivery between an XY moving body and an X driving body.

In this embodiment, the delivery member 811 having the rectangularly shaped grooves is provided on the side of the XY moving body 3 and the recovery ports 841 opposing the delivery member 811 are provided on the side of the X driving body 41 (or Y driving body 42). However, this does not impose a limitation upon the invention. For example, as shown in FIG. 10, the delivery member 811 may be provided on the side of the X driving body 41 (or Y driving body 42) and the recovery ports 841 opposing the delivery member 811 may be provided on the side of the XY moving body 3.

Furthermore, the arrangement for delivering exhaust between the XY moving body 3 and X driving body 41 can be applied similarly to the arrangement for delivering exhaust between the XY moving body 3 and Y driving body 42.

(Exhaust System Delivery Between X Driving Body and Table)

Figure 11:
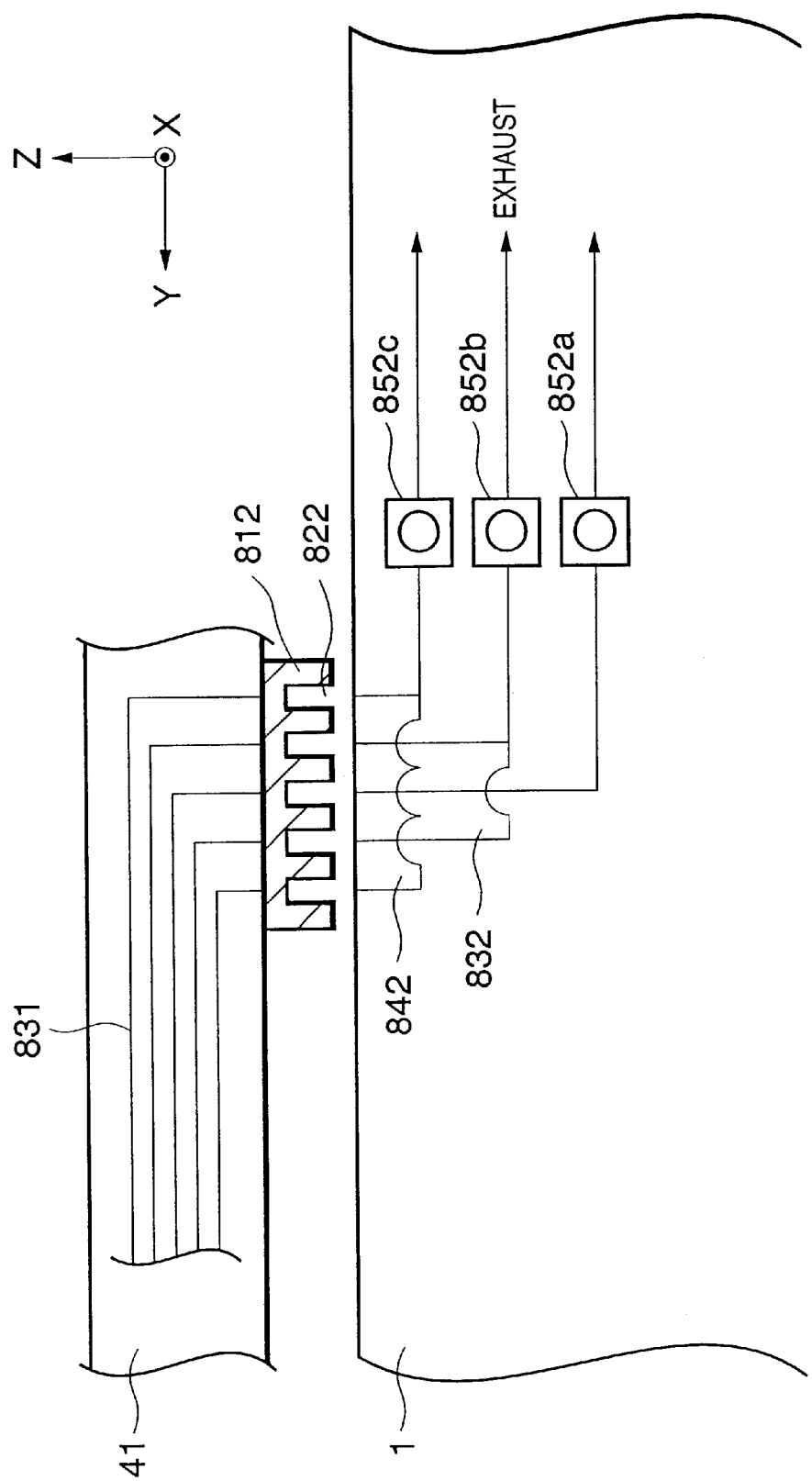
FIG. 11 is a diagram for describing exhaust system delivery between an X driving body and a table.

FIG. 11 is a diagram for describing handling of exhaust between the X driving body 41 and a table 1. FIG. 11 shows the YZ plane as viewed along the X direction.

The X driving body 41 is capable of moving along the X direction, as mentioned above. The X driving body 41 is internally provided with the recovery passages 831 for recovering gas from the XY static pressure bearing, as set forth above.

A delivery member 812 is for delivering exhaust between the X driving body 41 and table 1. The delivery member 812 is provided between the X driving body 41 and table 1. In this embodiment, the delivery member 812 is provided on the side of the X driving body 41. Recovery grooves 822 of the delivery member 812 communicate with the recovery passages 831 provided in the X driving body.

A plurality of recovery passages 832 are provided in the table 1. A plurality of recovery ports 842 provided at positions opposing the delivery member 812 are disposed on the side of the table 1.

The recovery ports 842 are required to oppose the recovery grooves 822 of the delivery member 812 at all times. Meanwhile, the X driving body 41 is moved along the X direction with respect to the table 1. Accordingly, the recovery grooves 822 of the delivery member 812 are rectangularly shaped grooves the longitudinal direction of which extends along the X direction.

The recovery passages 832 provided in the table 1 communicate with vacuum pumps 852. The latter withdraw gas from the recovery passages 832 and establish negative pressure in the recovery passages 832. Gas within the recovery grooves 822 of the delivery member 812 is withdrawn via the recovery ports 842 communicating with the recovery passages 832 so that negative pressure is established also within the recovery grooves 822 of the delivery member 812. When negative pressure is established within the recovery grooves 822 of the delivery member 812, negative pressure is produced within the recovery passages 831 as well because the recovery grooves 822 and recovery passages 831 of the X driving body 41 communicate with each other. This is the reason for the above-mentioned passage stating that negative pressure is established within the recovery passages 831.

As a result of the above arrangement, the gas ejected from the static pressure bearing 631 of the XY moving body 3 is delivered contactlessly between the X driving body 41 and the table 1 by the delivery member 812 and recovery ports 842 so that the gas is exhausted to the outside via the X driving body 41.

As mentioned above, the pressures within the plurality of recovery passages 831 differ. In order to achieve this, it will suffice to so arrange it that the pressure within the plurality of recovery grooves 822 provided in the delivery member 812 is lower the closer the groove is to the outer side. This is to assure that the recovered gas will not leak to the outside. Accordingly, the inner-side groove of the recovery grooves 822 communicates with the recovery port 841 that opposes the inner-side groove of the recovery grooves 821 of the delivery member 811 provided in the XY moving body 3. Furthermore, the vacuum pump 852 that communicates with the recovery port 842 opposing the outer-side groove of the delivery member 812 applies a lower pressure than the vacuum pump 852 that communicates with the recovery port 842 opposing the inner-side groove of the delivery member 812.

In this embodiment, the delivery member 812 having the rectangularly shaped grooves is provided on the side of the X driving body 41 and the recovery ports 842 opposing the delivery member 812 are provided on the side of the table 1. However, this does not impose a limitation upon the invention. For example, the delivery member 812 may be provided on the side of the table 1 and the recovery ports 842 opposing the delivery member 812 may be provided on the side of the X driving body 41.

Furthermore, the exhaust system delivery arrangement between the X driving body 41 and table 1 can be applied similarly to the exhaust system delivery arrangement between the Y driving body 42 and table 1.

In accordance with this embodiment, the number of pipes connected to the XY moving body can be reduced. Accordingly, it is possible to suppress a decline in positioning precision of the XY moving body caused by friction and resistance of the piping. Further, leakage from the piping can be prevented because the amount of piping is reduced.

<Second Embodiment>

(Exhaust System Delivery)

Figure 12:
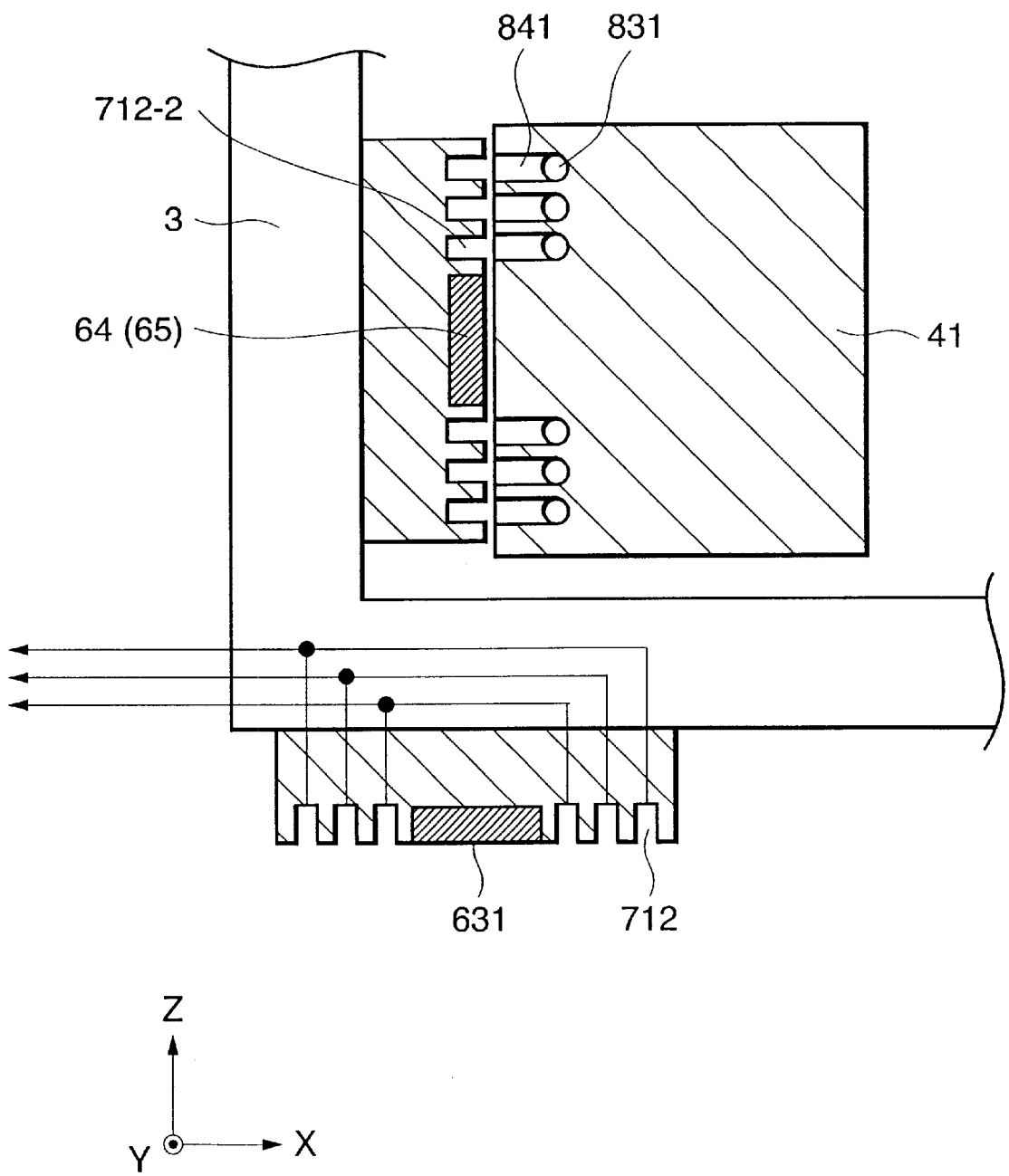
FIG. 12 is a diagram (XZ sectional view) useful in describing exhaust system delivery between an XY moving body and an X driving body according to a second embodiment of the present invention.
Figure 13:
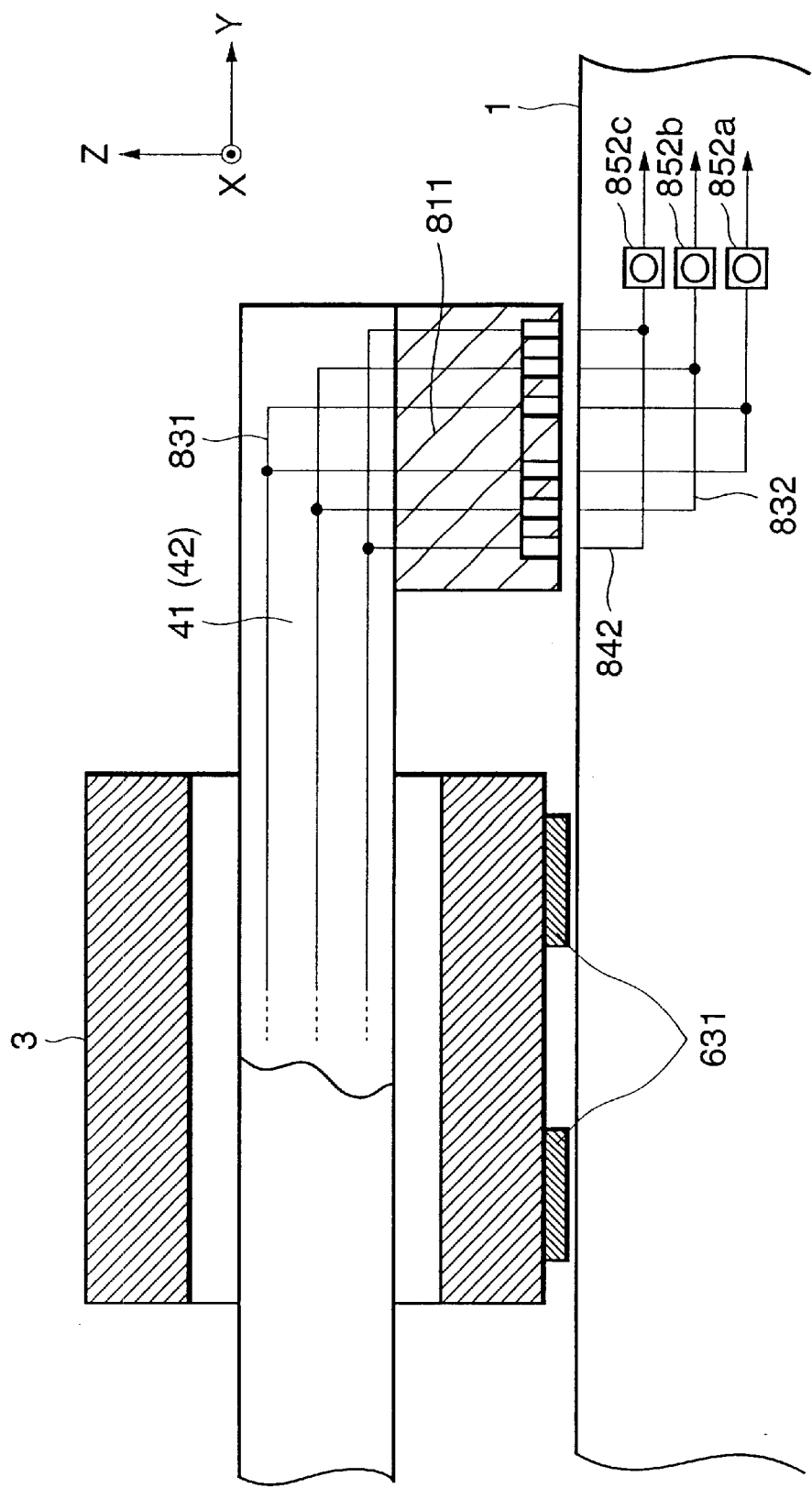
FIG. 13 is a diagram (YZ sectional view) useful in describing exhaust system delivery between an X driving body and a table according to the second embodiment.

FIGS. 12 and 13 are diagrams useful in describing a stage device according to a second embodiment of the present invention. FIG. 12, which is a diagram useful in describing exhaust system delivery between the XY moving body 3 and X driving body 41 (or Y driving body 42), is a view of the XZ plane as seen along the Y direction. FIG. 13, which is a diagram useful in describing exhaust system delivery between the X driving body 41 (or Y driving body 42) and table 1, is a view of the YZ plane as seen along the X direction. The overall structure of the stage device is substantially the same as that of the foregoing embodiment and therefore identical components are designated by identical reference characters and need not be described again.

In the foregoing embodiment, gas from the static pressure bearings between the XY moving body 3 and table 1 is recovered. However, this embodiment is not limited to this arrangement and it is possible to reduce piping in other components as well. This embodiment illustrates a mechanism for recovering gas from the static pressure bearings between the XY moving body 3 and X driving body 41.

A static pressure bearing (which corresponds to the XY static pressure bearing 631 of the first embodiment) 64 (or 65) is provided between the XY moving body 3 and X driving body 41 (or Y driving body 42). The static pressure bearing 64 ejects gas, maintain non-contact between the X driving body 41 and XY moving body 3 and supports the XY moving body 3 movably in the Y direction with respect to the X driving body. When the X driving body 41 is driven along the X direction, a force in the X direction is applied to the XY moving body via an air film formed by the static pressure bearing 64.

In a manner similar to that of the XY static pressure bearing 631 of the first embodiment, a plurality of exhaust grooves are provided surrounding the static pressure bearing 64. According to this embodiment, exhaust grooves 712-2 also perform the function of the recovery grooves in the above-described delivery member. The exhaust grooves 712-2 are rectangularly shaped grooves the longitudinal direction of which extends along the Y direction.

The recovery passages 831 are provided in the X driving body 41 in a manner similar to that of the first embodiment. Recovery ports 841 are provided at positions opposing the exhaust grooves 712. When negative pressure is produced within the recovery passages 831 and recovery ports 841, the gas within the exhaust grooves 712 is withdrawn and negative pressure is established within the exhaust grooves 712. Accordingly, the gas from the static pressure bearing 63 is withdrawn by negative pressure and is exhausted by the vacuum pumps 852A to 852B (FIG. 13) via the recovery ports 841 and recovery passages 831 through the delivery member 811 (FIG. 13) provided in the X driving body 41 and recovery ports 842 provided in the table 1.

In accordance with this embodiment, it is possible to reduce the piping to the XY moving body 3 for recovering the gas ejected from the static pressure bearing 64. Accordingly, even if piping is made directly to the XY moving body 3 in order to recover the gas from the XY static pressure bearing 631 (FIG. 12), the number of pipes can be reduced with regard to exhaust from the static pressure bearing 64.

<Embodiment of Exposure Apparatus>

Figure 14:
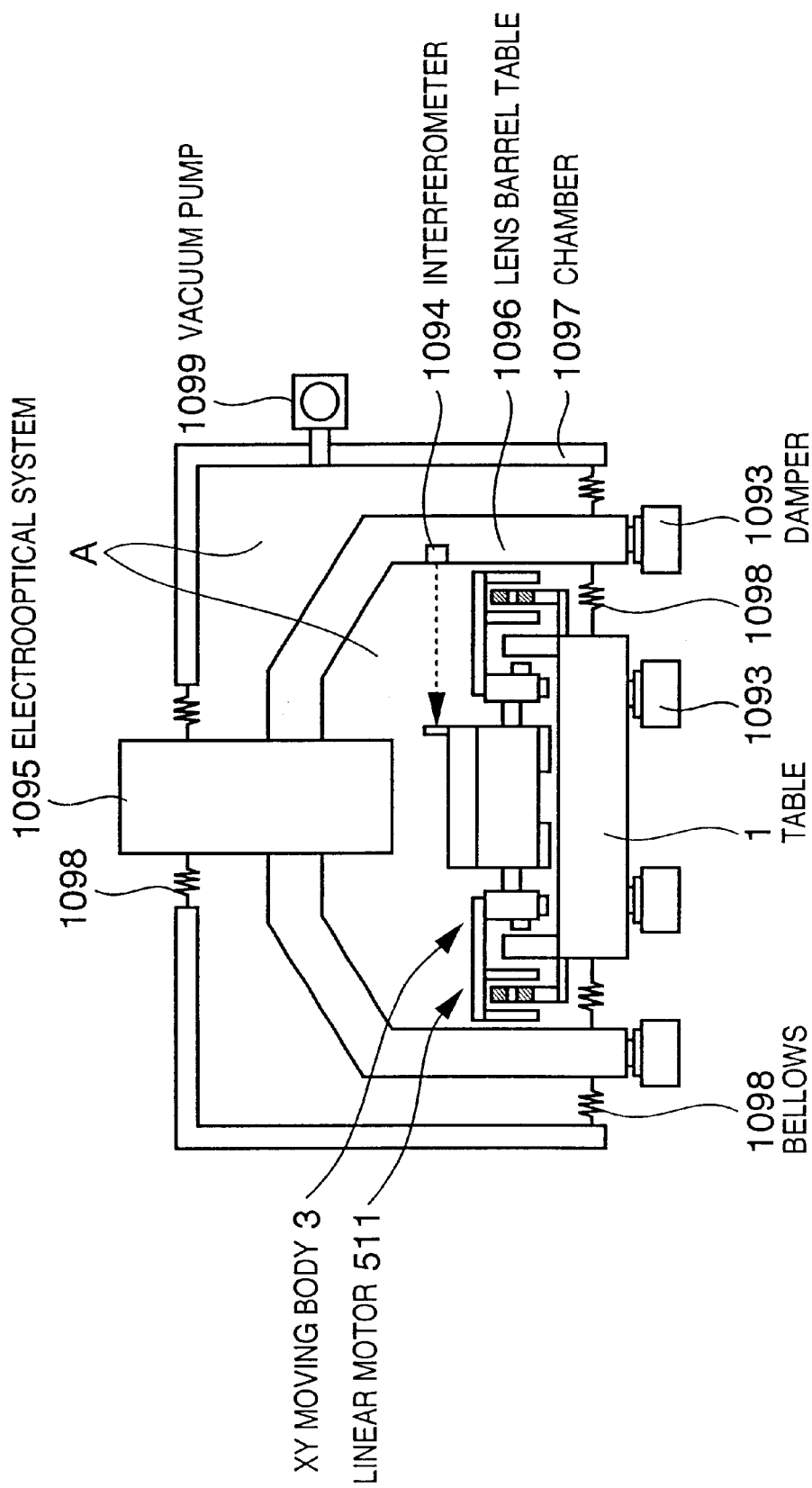
FIG. 14 is a schematic view of an embodiment of an electron beam exposure apparatus.

FIG. 14 is a schematic view of an electron beam exposure apparatus using the stage of the foregoing embodiment.

In FIG. 14, the stage device of the above embodiment is provided in order to mount and position a wafer. Vibration from the floor is prevented from reaching the table 1 by dampers 1093, which may be passive or active dampers. Each damper has an air spring, by way of example, and further includes an actuator if the damper is an active damper. The XY moving body 3 has its position measured by an interferometer 1094 and is positioned at a prescribed point based upon the results of position measurement.

The electron beam exposure apparatus has an electrooptical system 1095, which includes an electron beam irradiating device and an electronic lens. The electrooptical system 1095 is supported on a lens barrel table 1096. The latter is supported on the dampers 1093 to eliminate vibration from the floor. The dampers that support the lens barrel table 1096 may be passive or active, as in the case of the above-mentioned dampers. The interferometer 1094 for measuring the position of the XY moving body 3 is provided on the lens barrel table 1096. As a result, the XY moving body 3 is positioned with the lens barrel table 1096, i.e., the electrooptical system 1095, serving as a reference.

A chamber 1097 hermetically seals off a prescribed area. The details of the prescribed area will become apparent from the description that follows below. Bellows 1098 maintain the integrity of the seal and allows displacement relative to an object. The bellows 1098 are provided between the chamber 1097 and electrooptical system 1095, between the chamber 1097 and lens barrel table 1096, and between the chamber 1097 and table 1. As a result, the environment A within the chamber is hermetically sealed. A vacuum pump 1099 exhausts the gas in the environment A of the chamber to establish a vacuum. Here it is not required that the vacuum environment be a strict vacuum; it will suffice if the environment is highly depressurized, as set forth above.

When the environment A within the chamber 1097 is made a vacuum environment by the vacuum pump, a pressure difference is produced between the interior and exterior of the chamber 10 and, as a consequence, the chamber 10 is deformed. On the other hand, the bellows 1098 is provided between the chamber 1097 and the electrooptical system 1095. The bellows 1098 allows relative displacement between the two while maintaining the seal. As a result, the influence of deformation of the chamber on the electrooptical system 1095 is reduced. Similarly, the bellows 1098 also is provided between the chamber 1097 and the lens barrel table 1096 so that the influence of deformation of the chamber on the lens barrel table 1096 is reduced. As a result, deformation of the chamber does not influence the electrooptical system.

By virtue of the exposure apparatus having the above-described structure, the environment surrounding the stage device is made a vacuum environment. A vacuum environment is established also around the vicinity of the static pressure bearings used in the stage device. When a vacuum environment surrounds the static pressure bearings, it is required that the fluid used in the static pressure bearings be prevented from leaking to into this atmosphere. Because the electron beam exposure apparatus of this embodiment uses the stage device described in the foregoing embodiments as is stage, it is possible to reduce the leakage of gas from the static pressure bearings into the vacuum environment.

This embodiment has been described using an example in which the stage device of the foregoing embodiments is applied to an electron beam exposure apparatus. However, this does not impose a limitation upon the present invention. It is particularly desirable that the stage device of the foregoing embodiments be applied to an exposure apparatus in which it is required that the environment surrounding the stage device be made a vacuum environment. Accordingly, the stage device of the foregoing embodiments may be applied to an EUV exposure apparatus.

<Embodiment of Device Production Method>

An embodiment of a method of producing devices utilizing the electronic beam exposure apparatus described above will now be set forth.

Figure 15:
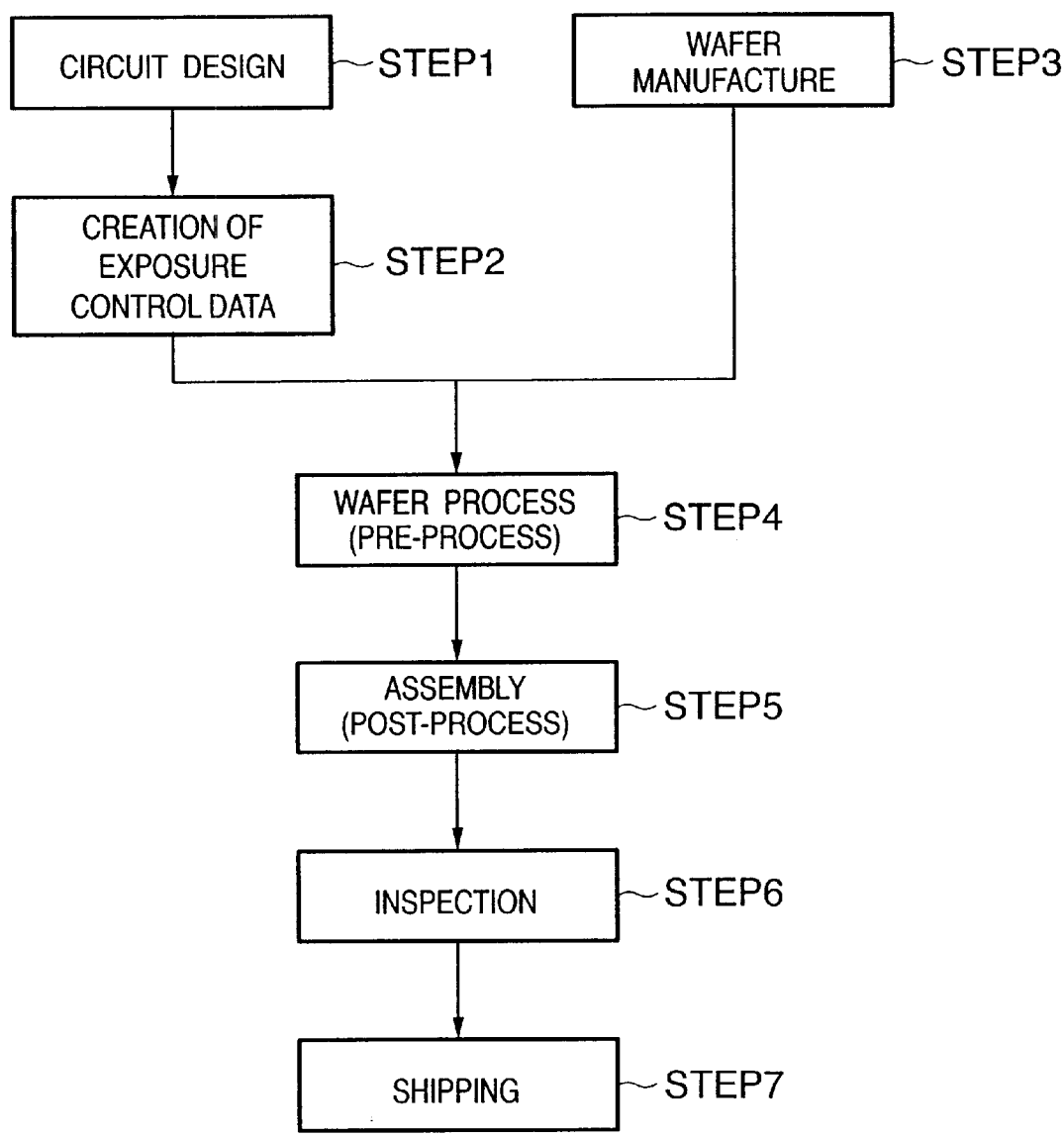
FIG. 15 is a flowchart of device manufacture.

FIG. 15 illustrates the flow of manufacture of a microdevice (a semiconductor chip such as an IC or LSI chip, a liquid crystal panel, a CCD, a thin-film magnetic head, a micromachine, etc.). The circuit for the semiconductor device is designed at step 1 (circuit design). Exposure control data of the exposure apparatus is created at step 2 (creation of exposure control data) based upon a circuit pattern that has been designed. Meanwhile, a wafer is manufactured using a material such as silicon or glass at step 3 (wafer manufacture). The actual circuit is formed on the wafer by lithography, using the prepared wafer and exposure apparatus to which the exposure control data has been input, at step 4 (wafer process), which is also referred to as "pre-treatment". Next, step 5 (assembly), which is also referred to as "post-treatment", is for obtaining the semiconductor chip using the wafer fabricated at step 4. This step includes steps such as actual assembly (dicing and bonding) and packaging (chip encapsulation). The semiconductor device fabricated at step 5 is subjected to inspections such as an operation verification test and durability test at step 6 (inspection). The semiconductor device is completed through these steps and then is shipped (step 7).

Figure 16:
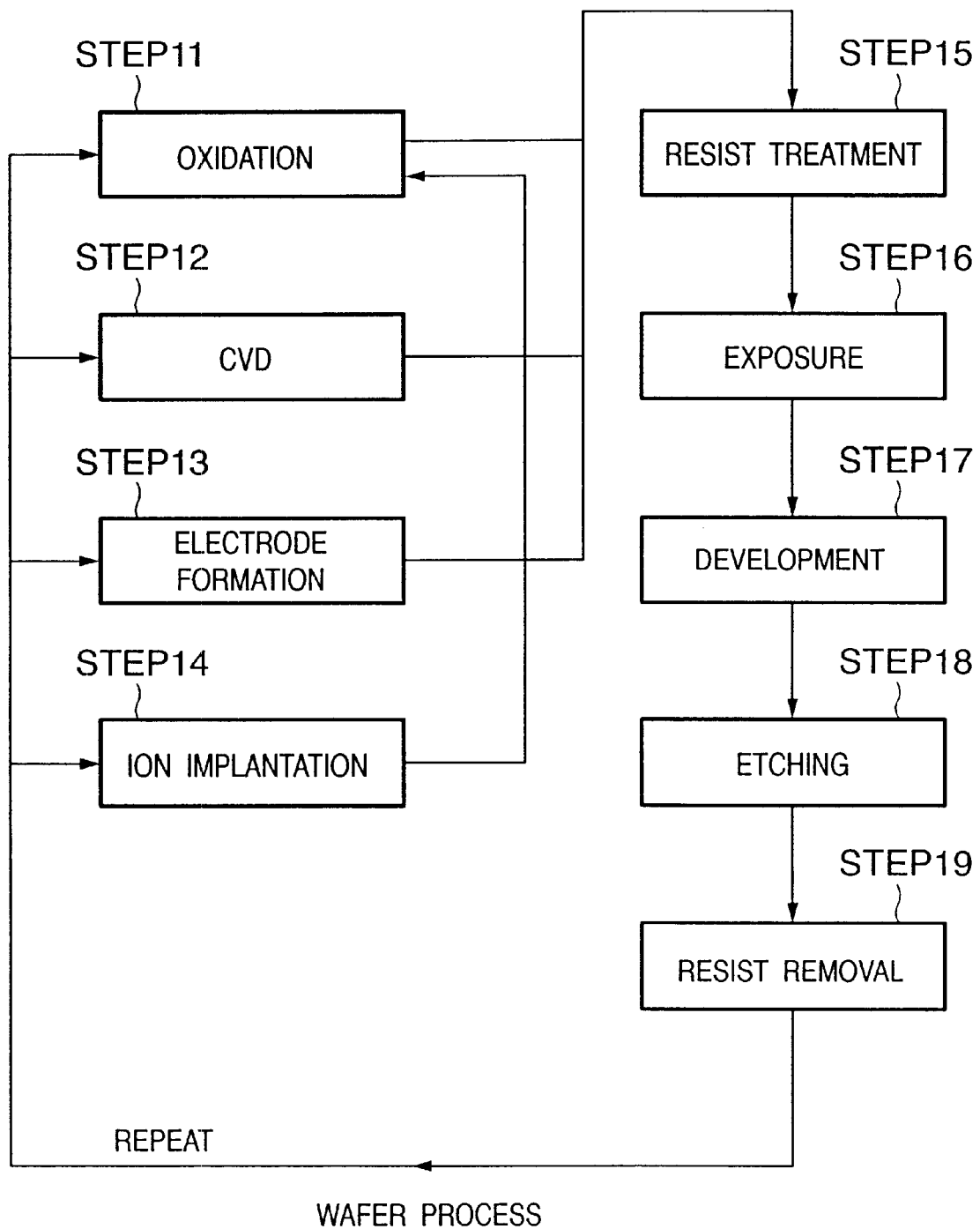
FIG. 16 is a flowchart of a wafer process.

FIG. 16 is a flowchart illustrating the detailed flow of the wafer process mentioned above. The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment), the wafer is exposed to the circuit pattern to print the pattern onto the wafer by the above-described exposure apparatus at step 16 (exposure), and the exposed wafer is developed at step 17 (development). Portions other than the developed photoresist are etched away at step 18 (etching), and unnecessary resist left after etching is performed is removed at step 19 (resist removal). Multiple circuit patterns are formed on the wafer by implementing these steps repeatedly.

If the manufacturing method according to this embodiment is used, a semiconductor device having a high degree of integration, which is difficult to manufacture in the prior art, can be manufactured at low cost.

In accordance with the stage device described in claim 1 of the present invention, piping to the moving body can be reduced. This makes it possible to raise the positioning precision of the moving body.

In accordance with the stage device according to the present invention, it is possible to reduce leakage of gas of static pressure bearings to the outside.

Further, in accordance with the stage device of the present invention, piping to the moving body can be reduced. As a result, positioning precision of the driving body can be improved and therefore so can the positioning precision of the moving body.

Further, in accordance with the stage device of the present invention, a change in bearing clearance can be reduced and both assembly and adjustment are facilitated.

As many apparently widely different embodiments of the present invention can be made without departing from the spirit and scope thereof, it is to be understood that the invention is not limited to the specific embodiments thereof except as defined in the appended claims.

What is claimed is:

1. A stage device comprising:
   a table having a reference plane parallel to first and second directions;
   a driving body movable along the first direction;
   a moving body movable along the second direction with respect to said driving body;
   a static pressure bearing provided on said moving body;
   an exhaust groove provided surrounding said static pressure bearing; and
   a mechanism for delivering a gas of said static pressure bearing recovered by said exhaust groove between said moving body and said driving body.

2. The device according to claim 1, wherein said static pressure bearing is provided between said moving body and said table; and
   said mechanism has a delivery member provided between said moving body and said driving body.

3. The device according to claim 2, wherein said delivery member has a rectangular groove.

4. The device according to claim 3, wherein said rectangular groove is such that the longitudinal direction thereof is parallel to the second direction.

5. The device according to claim 2, wherein recovery ports are provided opposing said delivery member.

6. The device according to claim 5, wherein said delivery member is provided on said driving body and said recovery ports are provided on said moving body.

7. The device according to claim 5, wherein said delivery member is provided on said moving body and said recovery ports are provided on said driving body.

8. The device according to claim 2, wherein said delivery member has a plurality of grooves.

9. The device according to claim 2, wherein a groove on an outer side of said delivery member surrounds a groove on an inner side thereof.

10. The device according to claim 9, wherein pressure within the groove on the outer side of said delivery member is set to be lower than pressure within the groove on the inner side thereof.

11. The device according to claim 9, wherein a plurality of exhaust grooves are provided surrounding said static pressure bearing.

12. The device according to claim 11, wherein an outer groove among the exhaust grooves is formed so as to surround the grooves on the inner side.

13. The device according to claim 12, wherein pressure within an outer groove of said exhaust grooves is set to be lower than pressure within the grooves on the inner side thereof.

14. The device according to claim 1, wherein said static pressure bearing is provided between said moving body and said driving body; and
   said mechanism is such that said exhaust groove functions also as a delivery member.

15. The device according to claim 1, further comprising a delivery member provided between said driving body and said table for delivering a gas of said static pressure bearing recovered by said exhaust groove between said driving body and said table.

16. The device according to claim 15, wherein said delivery member provided between said driving body and said table has a rectangular groove.

17. The device according to claim 16, wherein said rectangular groove is such that the longitudinal direction thereof is parallel to the first direction.

18. The device according to claim 15, said delivery member provided between said driving body and said table has a plurality of grooves.

19. The device according to claim 18, wherein an outer groove of said delivery member is formed so as to surround the grooves on the inner side.

20. The device according to claim 19, wherein pressure within an outer groove is set to be lower than pressure within the grooves on the inner side thereof.

21. The device according to claim 15, further comprising a vacuum pump for recovering a gas of said static pressure bearing recovered by said exhaust grooves.

22. The device according to claim 21, wherein said vacuum pump recovers gas of said static pressure bearing via said delivery member provided between said moving body and said driving body and said delivery member provided between said driving body and said table.

23. The device according to claim 1, wherein said device is used in a vacuum environment.

24. The device according to claim 1, further comprising a driving body movable along the second direction, wherein said moving body is movable along the first direction with respect to the driving body movable along the second direction.

25. A stage device comprising:
a table having a reference plane parallel to first and second directions;
a first driving body movable along the first direction;
a second driving body movable along the second direction;
a moving body movable along the second direction with respect to said first driving body, movable along the first direction with respect to said second driving body, and movable along the reference plane;
a first radial bearing unit for supporting said first driving body movably in the first direction;
a first plane bearing unit for restraining said first driving body vertically;
a second radial bearing unit for supporting said second driving body movably in the second direction; and
a second plane bearing unit for restraining said second driving body vertically.

26. The device according to claim 25, wherein said first and second radial bearing units each have a static pressure bearing secured to said table.

27. The device according to claim 26, wherein said first and second radial bearing units each further include an exhaust groove, which is for recovering gas of said static pressure bearing, on an outer side of said static pressure bearing.

28. The device according to claim 27, wherein a plurality of the exhaust grooves are provided.

29. The device according to claim 25, wherein said first and second plane bearing units each have a static pressure bearing secured to said table.

30. The device according to claim 29, wherein said first and second plane bearing units each further include an exhaust groove, which is for recovering gas of said static pressure bearing, surrounding said static pressure bearing.

31. The device according to claim 30, wherein a plurality of the exhaust grooves are provided.

32. The device according to claim 30, wherein an outer groove among the plurality of exhaust grooves is formed so as to surround the grooves on the inner side.

33. The device according to claim 32, wherein pressure within the outer groove is set to be lower than pressure within the grooves on the inner side thereof.

34. An exposure apparatus having a stage device for mounting a wafer and positioning the wafer at an exposure position, said stage device comprising:
a table having a reference plane parallel to first and second directions;
a driving body movable along the first direction;
a moving body movable along the second direction with respect to said driving body;
a static pressure bearing provided on said moving body;
an exhaust groove provided surrounding said static pressure bearing; and
a mechanism for delivering a gas of said static pressure bearing recovered by said exhaust groove between said moving body and said driving body.

35. The apparatus according to claim 34, wherein said apparatus is an electron beam exposure apparatus or an EUV exposure apparatus.

36. The apparatus according to claim 34, further comprising a chamber surrounding said stage device.

37. A device manufacturing method comprising the steps of:
coating a substrate with a photoresist;
exposing the substrate using an exposure apparatus; and
developing the substrate that has been exposed;
wherein said exposure apparatus has a stage device for mounting a wafer and positioning the wafer at an exposure position, said stage device comprising:
a table having a reference plane parallel to first and second directions;
a driving body movable along the first direction;
a moving body movable along the second direction with respect to said driving body;
a static pressure bearing provided on said moving body;
an exhaust groove provided surrounding said static pressure bearing; and
a mechanism for delivering a gas of said static pressure bearing recovered by said exhaust groove between said moving body and said driving body.

38. A device manufacturing method comprising the steps of:
coating a substrate with a photoresist;
exposing the substrate using an exposure apparatus; and
developing the substrate that has been exposed;
wherein said exposure apparatus has a stage device for mounting a wafer and positioning the wafer at an exposure position, said stage device comprising:
a table having a reference plane parallel to first and second directions;
a first driving body movable along the first direction;
a second driving body movable along the second direction;
a moving body movable along the second direction with respect to said first driving body, movable along the first direction with respect to said second driving body, and movable along the reference plane;
a first radial bearing unit for supporting said first driving body movably in the first direction;
a first plane bearing unit for restraining said first driving body vertically;
a second radial bearing unit for supporting said second driving body movably in the second direction; and
a second plane bearing unit for restraining said second driving body vertically.

39. A movement guidance method comprising the steps of:
establishing negative pressure in a recovery passage provided in a table;
establishing negative pressure in a groove of a delivery member provided between a driving body, which is movable in a first direction, and the table;
establishing negative pressure in a recovery passage provided in the driving body;
establishing negative pressure in a groove of a delivery member provided between a moving body, which is movable in a second direction with respect to the driving body, and the driving body; and establishing negative pressure in an exhaust groove surrounding a static pressure bearing provided on the moving body.

40. The method according to claim 39, wherein the delivery member provided between the moving body and the driving body has a plurality of grooves, a groove on an outer side is formed so as to surround the grooves on an inner side thereof, said method further comprises a step of making pressure within the groove on the outer side less than the pressure within the grooves on the inner side.

41. The method according to claim 39, wherein the delivery member provided between the driving body and the table has a plurality of grooves, a groove on an outer side is formed so as to surround the grooves on an inner side thereof, said method further comprises a step of making pressure within the groove on the outer side less than the pressure within the grooves on the inner side.

42. A movement guidance method comprising the steps of:

recovering gas from a static pressure bearing, which is provided on a moving body, by an exhaust groove provided surrounding the static pressure bearing;

delivering the gas from the static pressure bearing recovered by the exhaust groove to a driving body via a delivery member provided between the driving body, which drives the moving body in a first direction, and the moving body;

passing the recovered gas through a recovery passage provided in the driving body;

delivering the recovered gas to a table via a delivery member provided between the driving body and the table; and exhausting the recovered gas via a recovery passage provided in the table.

43. The method according to claim 42, wherein the delivery member provided between the moving body and the driving body has a plurality of grooves, a groove on an outer side is formed so as to surround the grooves on an inner side thereof, said method further comprises a step of making pressure within the groove on the outer side less than the pressure within the grooves on the inner side.

44. The method according to claim 42, wherein the delivery member provided between the driving body and the table has a plurality of grooves, a groove on an outer side is formed so as to surround the grooves on an inner side thereof, said method further comprises a step of making pressure within the groove on the outer side less than the pressure within the grooves on the inner side.

45. An exposure apparatus having a stage device for mounting a wafer and positioning the wafer at an exposure position, said stage device comprising:

a table having a reference plane parallel to first and second directions;

a first driving body movable along the first direction;

a second driving body movable along the second direction;

a moving body movable along the second direction with respect to said first driving body, movable along the first direction with respect to said second driving body, and movable along the reference plane;

a first radial bearing unit for supporting said first driving body movably in the first direction;

a first plane bearing unit for restraining said first driving body vertically;

a second radial bearing unit for supporting said second driving body movably in the second direction; and a second plane bearing unit for restraining said second driving body vertically.

46. The apparatus according to claim 45, further comprising a chamber surrounding said stage device.

47. The apparatus according to claim 45, wherein said apparatus is an electron beam exposure apparatus or an EUV exposure apparatus.

* * * * *